United States Patent [19]

Goldman et al.

[11] 4,279,947
[45] Jul. 21, 1981

[54] DEPOSITION OF SILICON NITRIDE

[75] Inventors: Jon C. Goldman, Tempe, Ariz.; Larry D. McMillan, Austin, Tex.; James B. Price, Phoenix, Ariz.

[73] Assignee: Motorola, Inc., Schaumburg, Ill.

[21] Appl. No.: 23,568

[22] Filed: Mar. 26, 1979

Related U.S. Application Data

[63] Continuation of Ser. No. 635,012, Nov. 25, 1975, abandoned.

[51] Int. Cl.$^3$ .............................................. C23C 11/14
[52] U.S. Cl. .................................. 427/255.2; 427/51; 427/94; 427/294
[58] Field of Search ............... 427/248 B, 94, 57, 294, 427/255.2

[56] References Cited

U.S. PATENT DOCUMENTS

| | | | |
|---|---|---|---|
| 3,537,891 | 11/1970 | Rairden | 427/294 |
| 3,574,014 | 4/1971 | Hugle | 427/94 |
| 3,578,495 | 5/1971 | Pammer et al. | 427/94 |
| 3,637,423 | 1/1972 | Sestrich | 427/94 |
| 3,652,324 | 3/1972 | Chu et al. | 427/94 |
| 3,798,061 | 3/1974 | Yamazaki | 427/248 B |
| 3,922,467 | 11/1975 | Pinchon | 428/411 |

FOREIGN PATENT DOCUMENTS 773702   5/1957   United Kingdom ................. 427/248 B

OTHER PUBLICATIONS

Aboaf, J. Electrochem. Soc., v. 116, No. 12, p. 1736 (1969).
Milek, *Silicon Nitride for Microelectronic Applications*, pp. 5, 7 and 19 (1971).

*Primary Examiner*—Ronald H. Smith
*Assistant Examiner*—Janyce A. Bell
*Attorney, Agent, or Firm*—John A. Fisher

[57] ABSTRACT

Silicon nitride is pyrolytically deposited by the reaction of a halosilane with ammonia in an evacuated system. The process is particularly useful in providing uniform layers of silicon nitride on silicon wafers to be used in the fabrication of semiconductor devices.

4 Claims, 2 Drawing Figures

DEPOSITION OF SILICON NITRIDE

This is a continuation of application Ser. No. 635,012, filed Nov. 25, 1975, now abandoned.

BACKGROUND OF THE INVENTION

This invention relates to the pyrolytic deposition of silicon nitride onto a heated substrate and to substrates having uniform films of silicon nitride deposited thereon. More particularly, this invention relates to the deposition of silicon nitride by reacting a halosilane with ammonia in an evacuated system.

Silicon nitride ($Si_3N_4$) is a dense, chemically inert, dielectric material of extreme hardness, low thermal conductivity and high resistance to molecular diffusion. These properties have made silicon nitride an attractive and valuable material for a wide range of applications. For example, it is useful in the fabrication of semiconductor devices as oxidation masks, capacitor dielectrics for bit storage, masking layers, polish retarders, etc.

Various methods for depositing silicon nitride are known, but while the processes described in the prior art are functional in certain applications, they present drawbacks in other areas. For example, it has been found to be extremely difficult to deposit silicon nitride onto semiconductor substrates in a manner that will allow a good growth rate, uniform deposition, and a high quality coating in an economical process.

Thus, the deposition of silicon nitride by the reaction of either silane or dichlorosilane with ammonia at a pressure of about 1 atmosphere is conventional. However, the aforementioned processes are not completely satisfactory for depositing silicon nitride on semiconductor substrates because of the high cost of the equipment, over-all processing costs including the necessity of employing a carrier gas, and low throughput. Furthermore, these processes result in poor thickness uniformity on individual wafers and from wafer-to-wafer.

Accordingly, E. Tanikawa et al in "Chemical Vapor Deposition In An Evacuated System", C.V.D. 4th International Conference, ECS, G. F. Wakefield and J. M. Blocher, ed., 261-273 (1973) describe the reaction of silane and ammonia in an evacuated system to deposit silicon nitride on silicon wafers. However, wafers treated according to this process have been found to have a thicker ring of silicon nitride around the edge of the wafer together with silicon or silicon nitride dust and boat marks on the wafers. Furthermore, for best results, wafer size and spacing in the furnace must be uniform in carrying out the deposition.

It has now been found in accordance with this invention that silicon nitride can be deposited to provide surprisingly unexpected results by employing a halosilane as a reactant and carrying out the process in a vacuum.

SUMMARY OF THE INVENTION

It is an object of the invention to provide an improved method for the pyrolytic deposition of silicon nitride.

It is a further object of this invention to provide an economical process for the deposition of silicon nitride characterized by high through-put.

It is another object of this invention to provide uniform and continuous coatings of silicon nitride which are free from defects.

It is still another object of this invention to provide improved yields of semiconductor devices made from silicon wafers having silicon nitride deposited thereon.

In accordance with this invention, silicon nitride is pyrolytically deposited upon a substrate by contacting a mixture of a halosilane and ammonia with a substrate in a vacuum at an elevated temperature.

The process of this invention will be better understood by reference to the following description of the invention and the accompanying drawings.

DETAILED DESCRIPTION OF THE INVENTION

Referring to the Figures, there is shown a furnace tube 10 heated by resistance heat coils 12 adjusted to give the desired temperature as described in detail below.

Figure 1:
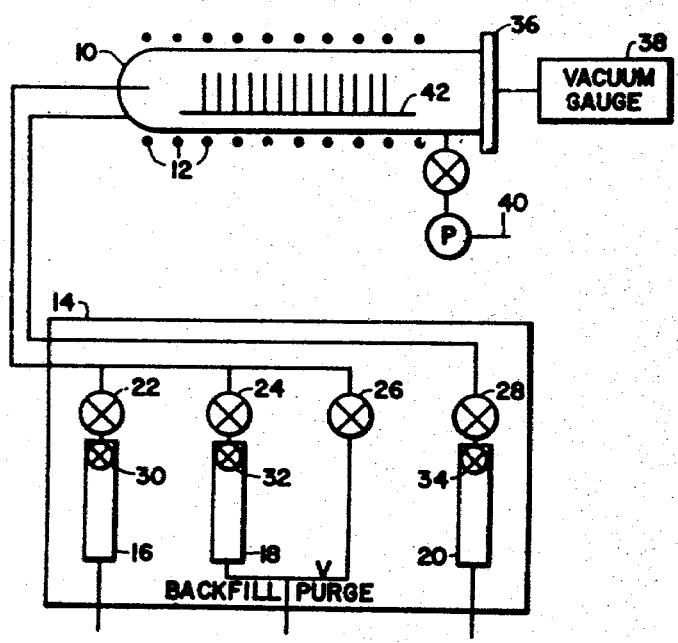
FIG. 1 is a schematic view of an apparatus for use in the process of this invention.
Figure 2:
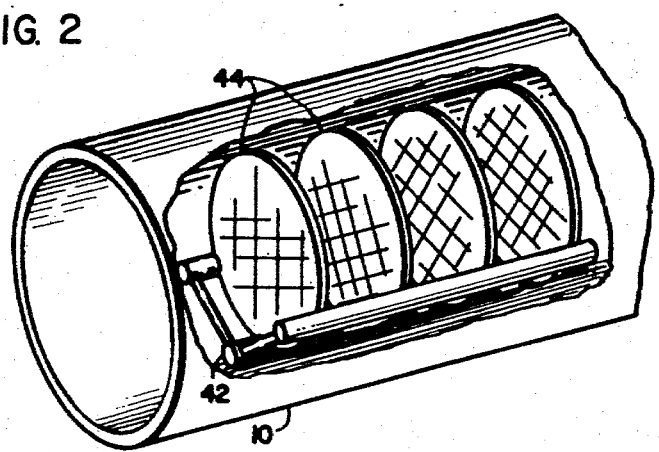
FIG. 2 is an isometric view, partly broken away, of a furnace tube loaded with wafers and suitable for use in the practice of this invention.

A gas panel generally referred to as 14 leads to the inlet end of furnace tube 10. This gas panel contains a source of halosilane 16, nitrogen 18 and ammonia 20, which are admitted to the furnace tube by opening valves 22, 24, 26 and 28. The halosilane is any monohalogenated or polyhalogenated silane, including the chlorosilanes, fluorosilanes, bromosilanes and iodosilanes. Preferably chlorosilanes such as chlorosilane, dichlorosilane, trichlorosilane and silicon tetrachloride are employed. The flow of gases is controlled by flow meter valves 30, 32 and 34. An end cap 36 is in engagement with furnace tube 10 to provide a vacuum seal within the tube, and the pressure is read by vacuum gauge 38. Exhaust 40 serves to vent by-products and unreacted starting materials from the tube. As shown, the furnace tube holds a quartz boat 42 loaded with a plurality of silicon wafers 44, which are positioned with their broad surfaces perpendicular to the cylindrical axis of the tube. The wafer positioning is clearer in FIG. 2. Preferably, a spacing of 50 to 500 mils between wafer surfaces is employed, with as many wafers as can be accommodated by the tube being processed at one time. While the type of wafer positioning shown in the drawings provides for maximum utilization of the tube, other means of positioning the wafers are contemplated. Furthermore, the process can be carried out in different types of vacuum apparatus.

In carrying out the process of this invention, the furnace tube is heated to the appropriate temperature for the particular halosilane and purged with nitrogen. Then the boat containing silicon wafers is loaded into the tube. The selected temperature should be high enough to give an acceptable growth rate while minimizing the competitive thermal decomposition of the halosilane to produce silicon. Generally a temperature between about 650° C. and 1000° C. is employed.

Another feature of this invention is that a temperature ramp can be established within the furnace tube. Thus, there can be a temperature variation along the tube, up to 100° C., and preferably from 10° C. to 50° C., with the lowest temperature being near the gas inlet end of the tube and the highest temperature near the opposite end of the tube. It has been found that utilizing a temperature ramp allows more flexibility in optimizing down-the-boat uniformity and deposition rate. Higher temperatures increase both the deposition rate and the source gas depletion. Source gas depletion decreases wafer uniformity down the boat. Since higher deposition rates are desirable to increase throughput, one compensates for source gas depletion by temperature ramping, with the more depleted end at the highest temperature.

After the boat has been loaded into the tube and the desired temperature achieved, a vacuum less than 50μ is established. Then, ammonia and halosilane are admitted to the tube, bringing the pressure to from about 300 millitor to about 10 torr. The flow is regulated so that the mole ratio of ammonia to halosilane is from about 1 to 500:1. Furthermore, the ammonia is metered into the furnace tube at a rate between about 0.01 and 10 cc/sec, while the halosilane is metered into the tube at a rate between about 0.01 and about 0.5 cc/sec. It has been found that the growth of silicon nitride under these conditions is about 5 to 100 A°/minute; the process is continued until the desired thickness is deposited on the wafers. For most semiconductor applications, 200–2000 A° thick layers are desired, but the process of the invention is suitable to deposit layers of any thickness.

The silicon nitride layers produced according to this process have been found to have many advantages over those produced by prior art processes. Thus, the peripheral ring of thicker nitride found on wafers treated with silane and ammonia under vacuum is eliminated. Furthermore, silicon or silicon nitride dust formation and boats marks found in the aforementioned silane process were reduced to an insignificant level. Since the silicon nitride layers are uniform, more devices can be made from semiconductor wafers treated in accordance with this invention, further enhancing the attractiveness of the process.

The following example will serve to illustrate the practice of this invention.

EXAMPLE 1

One hundred fifteen precleaned 3-inch diameter silicon wafers were loaded into a three-rail quartz boat 16 inches long with 3/32 inch wafer spacing; in accordance with standard diffusion techniques, five dummy wafers were placed at each end of the boat. Then the boat was placed in a 101 mm outside diameter quartz tube in a thermco furnace. The temperature profile of the furnace was ramped so that thermocouple measurements at three equidistant points covering the center 20 inches of the furnace gave readings of 730° C., 750° C. and 770° C. respectively, with the lowest temperature at the end adjacent to the gas inlet. The furnace was evacuated to less than 50μ and purged with nitrogen for ten minutes at a pressure of 2 torr. Then the nitrogen was turned off and the system pumped down to a pressure less than 50μ. Ammonia was injected at a flow rate of 0.24 cc/sec for one minute. Then dichlorosilane was injected at a flow rate of 0.02 cc/sec while continuing the injection of ammonia. After 60 minutes, the dichlorosilane flow was terminated and the ammonia flow was terminated one minute later. These flow rates correspond to a molar ratio of ammonia to dichlorosilane of about 12 to 1. Then the furnace was pumped to a pressure of less than 50μ and purged with nitrogen for five minutes at a pressure of 2 torr. The vacuum valve was closed and the system back-filled with nitrogen. The boat was unloaded and the wafers evaluated. They were found to have a 1000A° thick layer of silicon nitride which was uniform from wafer to wafer ±10%, and around the wafer ±1%; the wafers exhibited no haziness and no boat marks.

What is claimed is:

1. A method for the pyrolytic deposition of silicon nitride upon a plurality of substrates which comprises placing said plurality of substrates in a reactor tube with their broad faces perpendicular to the flow of a mixture of dichlorosilane and ammonia at a temperature of from about 650° C. to about 1000° C. in a vacuum of about 300 millitorr to about 10 Torr.

2. The method of claim 1 where said temperature is from about 770° C. to about 780° C.

3. The method of claim 1 wherein the temperature is ramped up to about 100° C. along the direction of said flow.

4. The method of claim 1 wherein the temperature is ramped up from 10° C. to 50° C. along the direction of said flow.

* * * * *

UNITED STATES PATENT AND TRADEMARK OFFICE
CERTIFICATE OF CORRECTION

PATENT NO. : 4,279,947
DATED : July 21, 1981
INVENTOR(S) : Jon C. Goldman et al

It is certified that error appears in the above—identified patent and that said Letters Patent is hereby corrected as shown below:

Column 4, claim 2, line 37, change "770°C. to about 780°C." to -- 730°C. to about 770°C. --.

*Signed and Sealed this*

*Eighth* Day of *December 1981*

[SEAL]

Attest:

GERALD J. MOSSINGHOFF

*Attesting Officer*   *Commissioner of Patents and Trademarks*